United States Patent
Lopata

(12) 
(10) Patent No.: US 6,265,941 B1
(45) Date of Patent: Jul. 24, 2001

(54) BALANCED DIFFERENTIAL AMPLIFIER HAVING COMMON MODE FEEDBACK WITH KICK-START

(75) Inventor: Douglas D. Lopata, Berks, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/438,770

(22) Filed: Nov. 12, 1999

(51) Int. Cl.[7] ........................................................ H03F 3/45
(52) U.S. Cl. .............................................. 330/258; 330/259
(58) Field of Search ........................... 330/253, 258, 330/259

(56) References Cited

U.S. PATENT DOCUMENTS 5,254,956 * 10/1993 Nishijima ................................ 330/258
5,838,200 * 11/1998 Opris ...................................... 330/258
5,955,922 * 9/1999 Nicollini et al. ....................... 330/258
6,052,025 * 4/2000 Chang et al. .......................... 330/253
6,147,552 * 11/2000 Sauer ......................................... 330/9

OTHER PUBLICATIONS

Electronic Circuit Design, An Engineering Approach, Savant, Jr. et al, The Benjamin/Cummings Publishing Company, Inc., 1987, Chapter 7, pp. 300, 302, 304, 308, 312, and 316–319.

* cited by examiner

Primary Examiner—Robert Pascal
Assistant Examiner—Henry Choe

(57) ABSTRACT

A differential amplifier including a balanced differential amplifier circuit having common-mode feedback with input stage tail current servoing now includes a kickstart circuit that ensures that the circuit will always start up and operate in its intended operating region, thus eliminating any latch-up or dead zone problems.

23 Claims, 5 Drawing Sheets

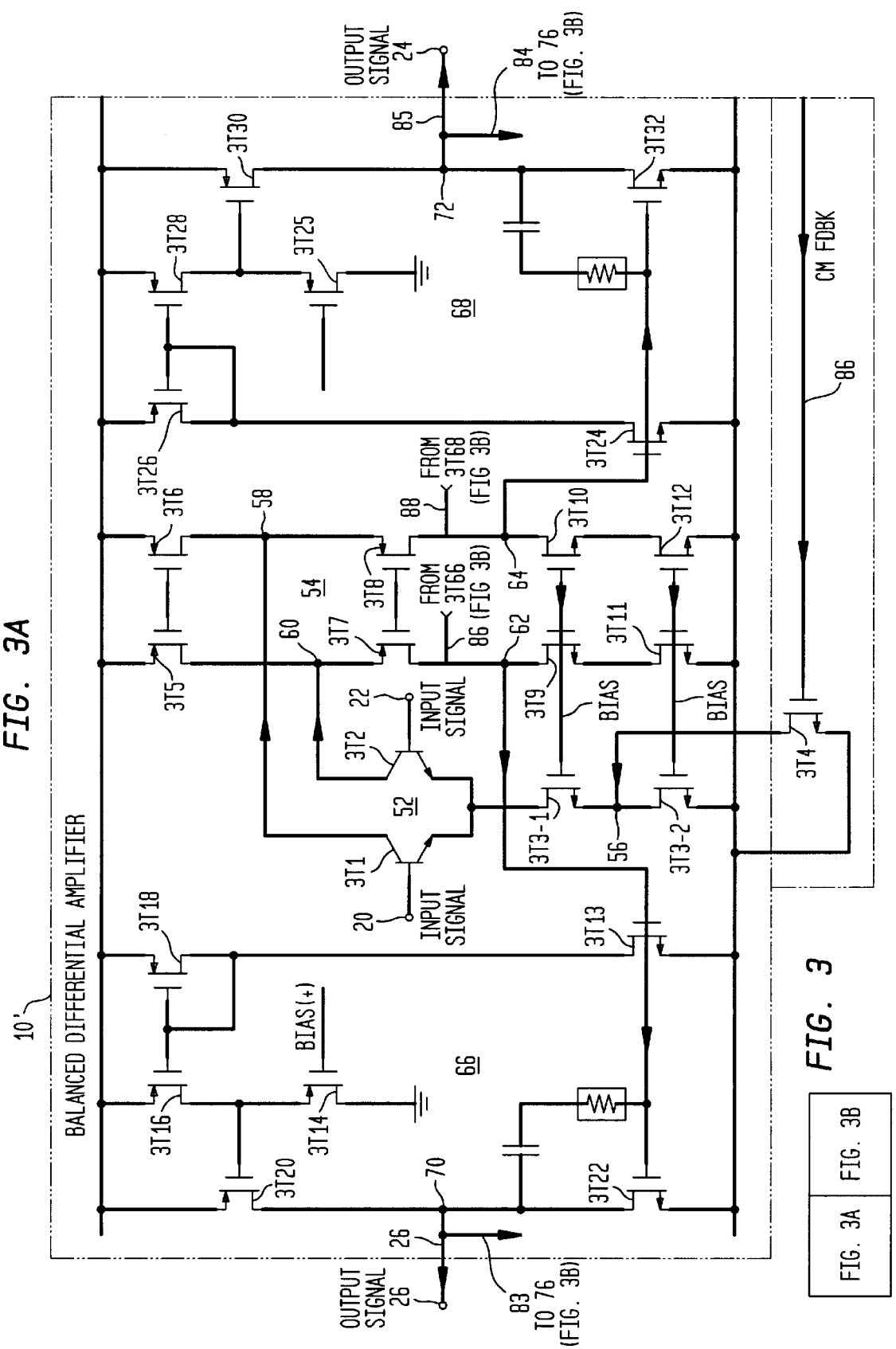

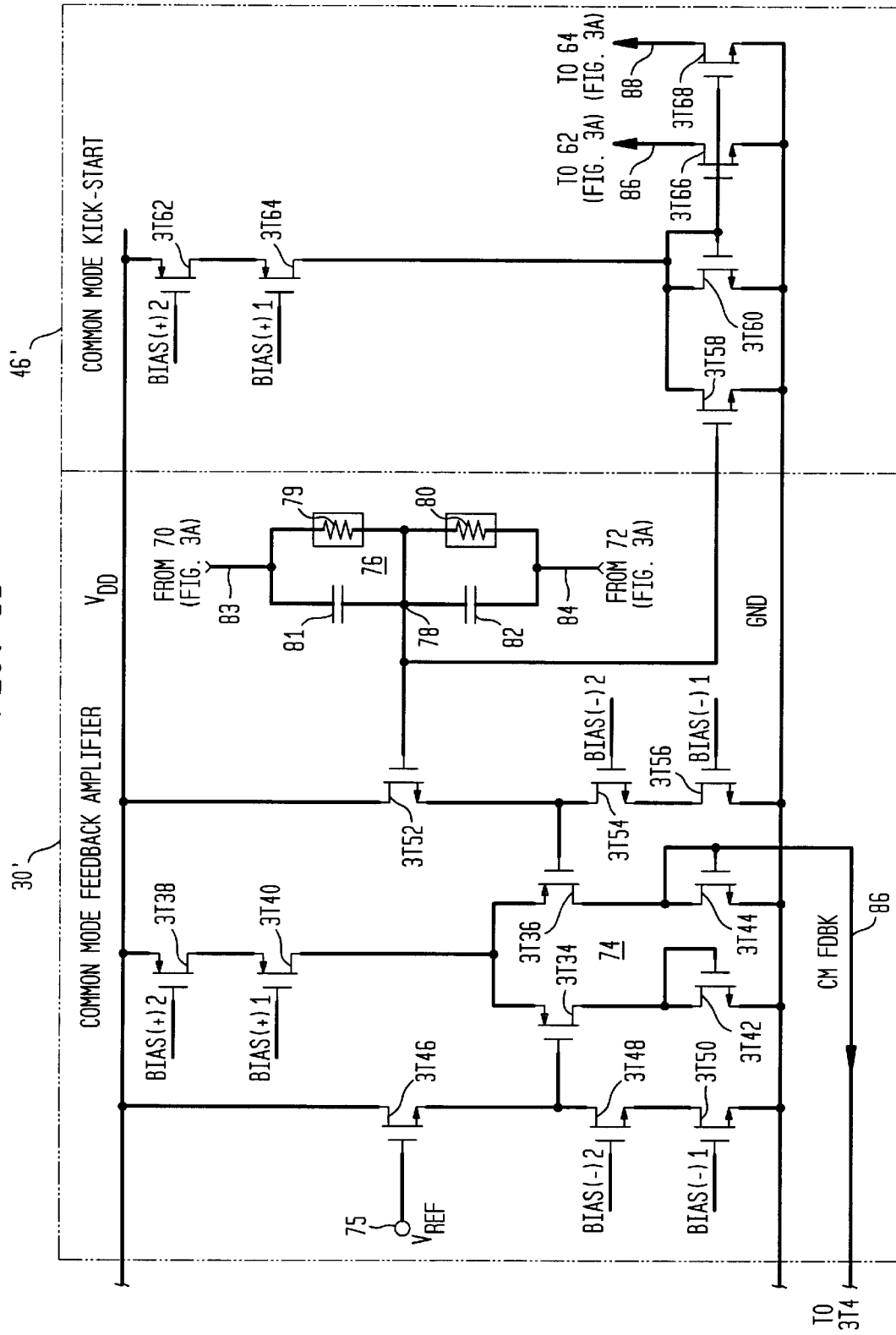

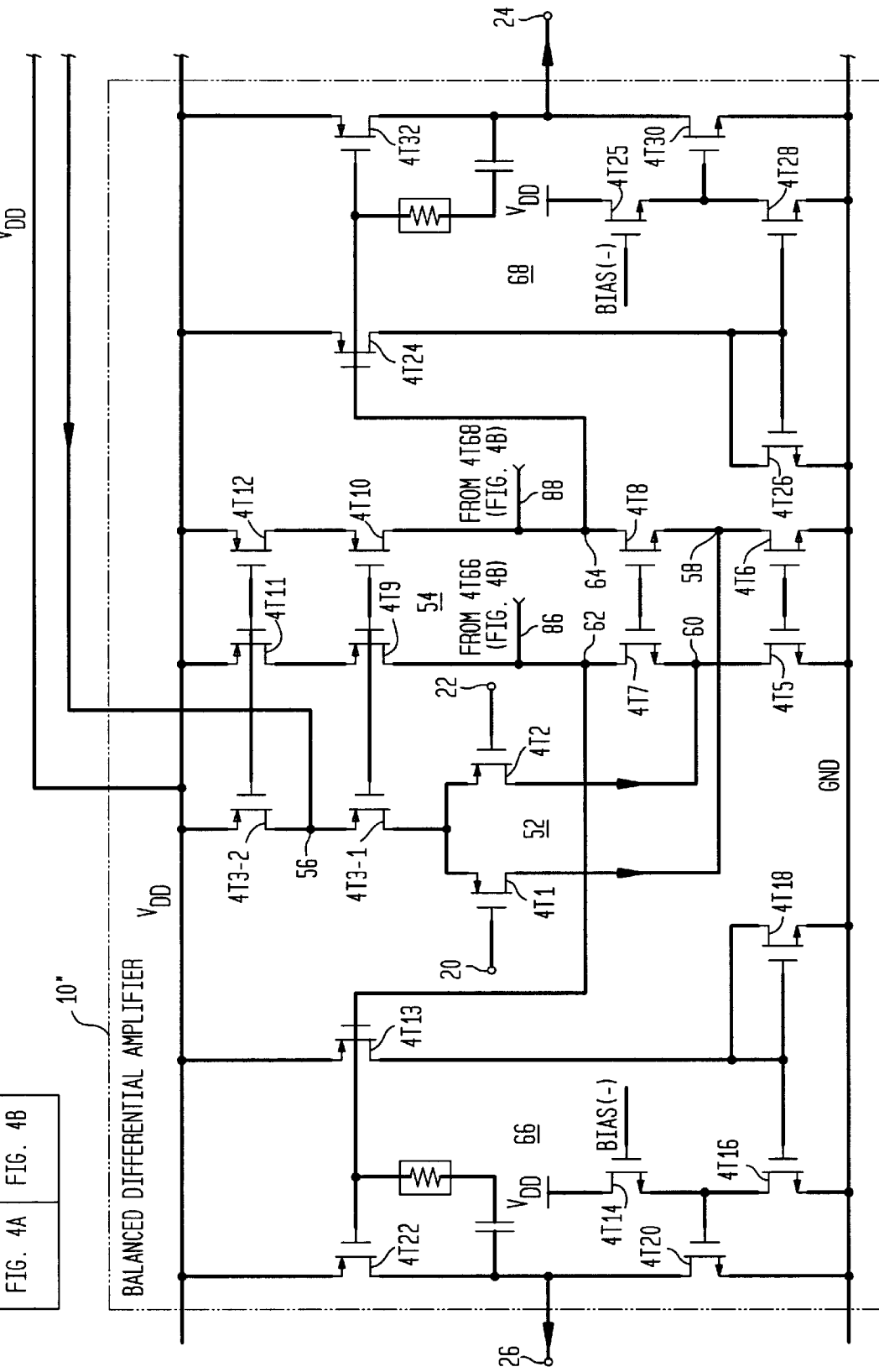

BALANCED DIFFERENTIAL AMPLIFIER HAVING COMMON MODE FEEDBACK WITH KICK-START

BACKGROUND OF THE INVENTION

1. Field of the Invention

This invention relates generally to electrical signal amplifiers, and more particularly to a differential amplifier having a balanced output and common-mode feedback.

2. Description of Related Art

A balanced or fully differential amplifier typically requires common-mode feedback to ensure that the amplifier operates in the region where its full differential dynamic range can be utilized. Certain implementations of common-mode feedback, however, may add additional voltage offset to the amplifier, move parasitic poles closer to the dominant pole, degrade stability or increasing the power required to obtain desired stability, causes common-mode to differential-mode signal conversion due to random mismatch of components, and/or may result in having latching or dead-zones from which the amplifier cannot recover and operate normally.

In an attempt to overcome these drawbacks, common-mode feedback using input stage tail current servoing and/or common-mode servoing using input stage active loads or folded-cascode active loads have been employed.

While common-mode feedback using input stage tail current servoing can have dead zones or start-up problems, it does nevertheless have certain desirable properties. For example, it does not permit common-mode to differential conversion and tends to exhibit a relatively enhanced bandwidth and offset properties. Common-mode servoing using input stage active loads or folded-cascode active loads can increase differential offset due to component mismatch, can degrade stability, can increase supply current required to maintain stability, and can allow common-mode to differential conversion.

SUMMARY

Accordingly, it is an object of the present invention to provide an improvement in differential amplifier circuitry.

It is another object of the invention to provide an improvement in a balanced differential amplifier utilizing common-mode feedback.

It is a further object of the invention to overcome the inherent problems and deficiencies associated with conventional balanced or fully differential amplifiers employing common-mode feedback.

The foregoing and other objects of the invention are directed to a balanced differential amplifier using common-mode feedback with input stage tail current servoing which solves the latch-up/dead-zone problem by inclusion of a kick-start circuit that ensures that the common-mode servo loop will always start up and force the amplifier into the intended operating region.

The preferred embodiment of the present invention is directed to a differential amplifier fabricated in an integrated circuit and comprising: a balanced differential amplifier circuit including first and second input ports and first and second output ports; a common-mode feedback circuit connected to the first and second output ports and generating a common-mode feedback signal which is coupled back to a predetermined circuit node of the amplifier circuit so as to form a common-mode servo loop; and, a kick-start circuit connected to the common-mode feedback circuit and generating a kick-start feedback signal which is coupled to a predetermined circuit node of the differential amplifier circuit to ensure that the circuit will start up and operate in its intended region.

Further scope of applicability of the present invention will become apparent from the detailed description provided hereinafter. It should be noted, however, that the detailed description and specific examples, which indicate the preferred embodiments of the invention, are provided by way of illustration only since various changes and modifications coming within the spirit and scope of the invention will become apparent to those skilled in the art from the following detailed description.

Brief Description of the Drawings

The present invention will become more fully understood when considered together with the accompanying drawings which are provided by way of illustration and thus are not meant to be limitative of the present invention, and wherein:

FIGS. 3A and 3B are schematic diagrams illustrative of the preferred embodiment of the subject invention; FIG. 3B is the other half of the schematic diagram shown in FIG. 3A.

FIGS. 4A and 4B are schematic diagrams illustrative of a complementary counterpart of the embodiment of FIGS. 3A and 3B.

FIG. 4B is a schematic diagram which is illustration of the other half of the schematic diagram shown in FIG. 4A.

DETAILED DESCRIPTION OF THE INVENTION

Figure 1:
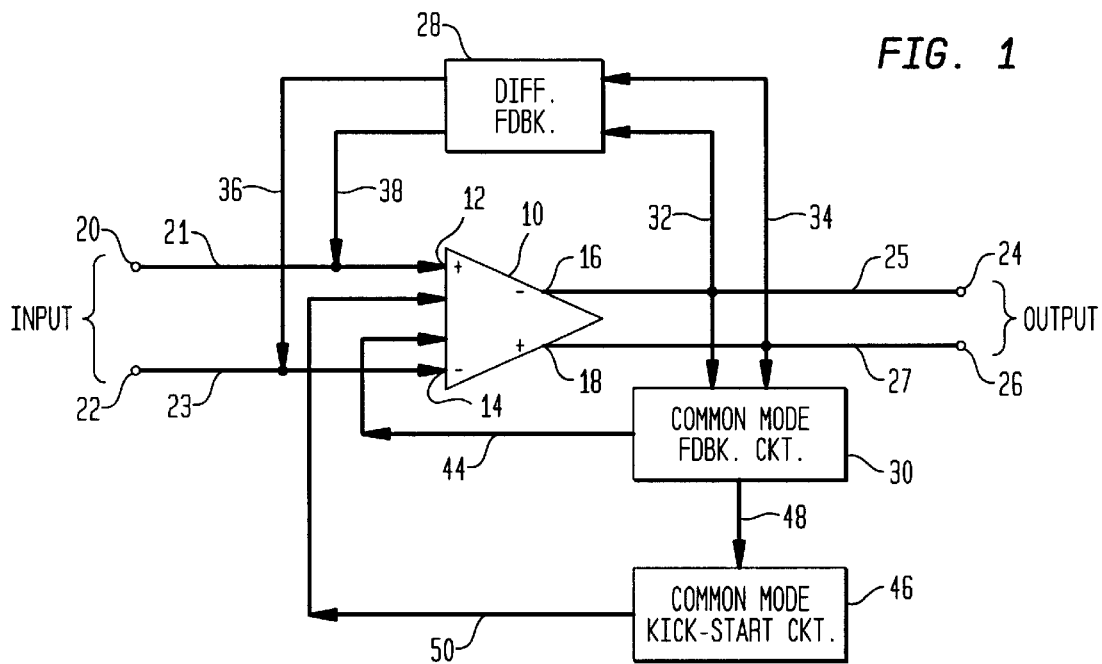
FIG. 1 is an electrical block diagram illustrative of the subject invention.

Referring now to the drawings wherein like reference numerals refer to like components throughout, FIG. 1 is broadly illustrative of the subject invention and depicts a conventional operational amplifier 10 which is used to implement a differential amplifier and having a pair of input signal ports shown as a positive (+) polarity input port 12 and a negative (−) polarity input port 14, as well as a pair of (−) and (+) polarity output ports 16 and 18. The pair of input ports 12 and 14 connect to a pair of signal input terminals 20 and 22 via signal leads 21 and 23, while the output ports 16 and 18 are connected to a pair of signal output terminals 24 and 26 via signal leads 25 and 27.

Such a circuit configuration is intended to be illustrative of a balanced or fully differential amplifier and as such typically includes a differential feedback circuit 28 and a common-mode feedback circuit 30. As shown in FIG. 1, the (−) and (+) output ports 16 and 18 are connected to the differential feedback circuit 28 via signal leads 32 and 34. The differential feedback circuit 28 includes a pair of output signal leads 36 and 38 which are respectively coupled back to the (+) and ) (−) input ports 12 and 14. With respect to the common-mode feedback circuit 30, it connects to the (−) and (+) output ports 16 and 18 by means of a pair of circuit leads 40 and 42 and includes a common-mode feedback signal lead 44 which connects back to the operational amplifier 10 as shown in FIG. 2 and which will be described below.

Such a configuration ensures that the operational amplifier operates in a region where its full differential dynamic range can be utilized. However, dead-zones or startup problems can occur. To overcome this drawback, the present invention additionally now employs a common-mode kick-start circuit which is shown in FIG. 1 by reference numeral 46 This circuit receives an input from the commonmode feedback circuit 30 via circuit lead 48 and connects back to the differential amplifier 10, as shown in FIG. 2, by circuit leads 50.

Figure 2:
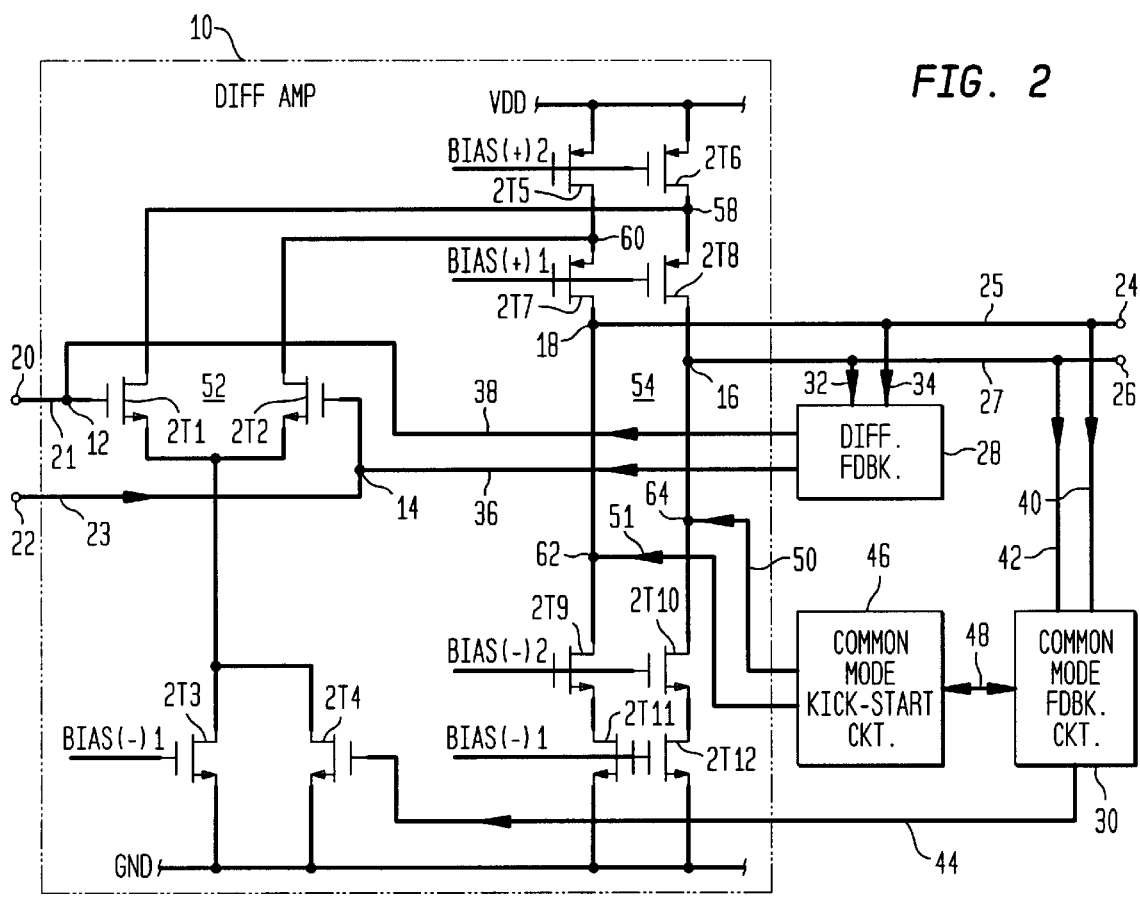
FIG. 2 is an electrical schematic/block diagram further illustrative of the invention shown in FIG. 1.

Considering now FIG. 2 in greater detail, it schematically depicts a balanced or fully differential amplifier comprised of field effect transistors. FIG. 2 is further intended to illustrate the input stage tail current servoing technique utilizing active loads as well as folded-cascode active loads.

As shown in FIG. 2, a pair of source coupled input stage transistors 2T1 and 2T2 of differential amplifier portion 52 of the operational amplifier 10 have their respective gate electrodes connected to the signal input terminals 20 and 22, while their sources are commonly connected to a bias transistor 2T3 and a feedback transistor 2T4. Transistor 2T4 operates to couple a common-mode feedback signal from the common-mode feedback circuit 30 to the gate of transistor 2T4, whose collector is connected to common emitters of 2T1 and 2T2.

A differential output appears at the drain electrodes of 2T1 and 2T2. This output is connected to an intermediate output circuit in the form of a folded cascode current source 54 via circuit nodes 58 and 60 which acts as an active load and is comprised of a set of four p-channel transistors 2T5, 2T6, 2T7, and 2T8, and a set of four n-channel transistors 2T9, 2T10, 2T11 and 2T12. Output terminals 24 and 26 are connected to the common drain connections of 2T7, 2T9 and 2T8, 2T10 which also define the output ports 16 and 18. It is also the location where the kick-start circuit 46 is connected, i.e., between the two sets of transistors at circuit nodes 62 and 64 which are coincident with the output ports and output terminals 24 and 26 Thus by adding the kick-start circuit 46, input stage tail current servoing can be used for robust common-mode feedback without concern for start-up conditions.

Complementary integrated circuit implementations of NPN/N channel input and PNP/P channel input transistor based designs of the subject invention are shown in FIGS. 3 and 4. These designs are substantially identical except for the use of mutually opposite type transistors and the required reversal of power supply connections.

Turning attention now FIG. 3 which is partitioned into two parts, namely FIGS. 3A and 3B for the sake of space, the differential amplifier portion 52 of a balanced differential amplifier 10' is again comprised of a pair of emitter coupled junction transistors, namely 3T1 and 3T2. It should be noted, however, that 3T1 and 3T2 could also be n-channel field effect transistors. The base electrodes of 3T1 and 3T2 are also again connected to input terminals 20 and 22. The common emitters are coupled to ground via a current source consisting of a pair of cascoded field effect transistors 3T3-1 and 3T3-2.

In FIG. 2, only one current source transistor 2T3 was utilized; however, now a common-mode feedback transistor 3T4 has its drain electrode coupled to circuit node 56 between the source and drain electrodes of the current source transistors 3T3-1 and 3T3-2. Again, the collector electrodes of the differential amplifier transistors 3T1 and 3T2 are connected to an intermediate output circuit comprising the folded cascode/current source circuit configuration 54 and consisting of two pairs of cascoded p-channel transistors 3T5, 3T6, 3T7, and 3T8, and two pairs of n-channel transistors 3T9, 3T10, 3T11, and 3T12 which acts as an active loads. With the collectors of transistors 3T1 and 3T2 connected to circuit nodes 58 and 60 in the upper set of p-channel transistors, intermediate output signals are provided at circuit nodes 62 and 64 between the two sets of p-channel and n-channel transistors. Circuit nodes 62 and 64 are respectively coupled to identical class AB balanced output stages 66 and 68.

The output stage 66 which provides one of a pair of differential output signals, is comprised of an input transistor 3T13, a bias transistor 3T14, a current source consisting of a current mirror comprised of transistors 3T16 and 3T18 and two output transistors 3T20 and 3T22, with the output signal appearing at the common connection between the drain electrodes of the output transistor at circuit node 70, which is common to output terminal 26.

The other class AB output stage 68 which provides the other differential output signal, as noted above, is identical to output stage 66, and as shown, includes an input transistor 3T24, a bias transistor 3T25, a current mirror current source consisting of transistors 3T26, and 3T28, and a pair of output transistors 3T30 and 3T32, with the output appearing at circuit node 72, which is common to output terminal 24.

Referring now to FIG. 3B, shown thereat is a common-mode feedback amplifier 30' and a common-mode kick-start circuit 46'. The common-mode feedback amplifier 30' includes a level shifted source coupled input stage 74 including transistors 3T34 and 3T36 with 1/gm active loads. The common source electrodes of 3T34 and 3T36 are connected to the VDD supply voltage via a current source consisting of two cascoded transistors 3T38 and 3T40. The respective drain electrodes of transistors 3T34 and 3T36 are connected to 1/gm active load transistors 3T42 and 3T44. The gate electrode of transistor 3T34 is connected to a common-mode reference voltage applied to the terminal 75 via transistor 3T46, whose emitter is connected to ground through a cascoded current source comprised of transistors 3T48 and 3T50. The drain of transistor 3T46 is connected directly to the VDD supply voltage.

A common-mode voltage is generated at circuit node 78 by a pair of parallel common-mode sense resistors 79 and 80, and a pair of parallel capacitors 81 and 82. The opposite ends of the network 76 connect to circuit leads 83 and 84 which are common to the balanced differential amplifier output circuit nodes 70 and 72 of FIG. 3A. The common-mode voltage at circuit node 78 is applied to the gate of transistor 3T52, whose source electrode is directly connected to the base of transistor 3T36 and the drain of transistor 3T54, the latter being one of two cascoded current source transistors 3T54 and 3T56. A common-mode feedback voltage signal is taken from the common connection of the gate and drain of transistor 3T44 where it connects to the gate of transistor 3T4 of the differential amplifier stage 52 of FIG. 3A via signal lead 86.

Further as shown in FIG. 3B, the common-mode voltage at circuit node 78 is also coupled to the kick-start circuit 46'. This circuit is comprised of a common-mode sense transistor 3T58, a current bias diode connected transistor 3T60, a pair of cascoded current source transistors 3T62 and 3T64 and a pair of kick-start signal feedback transistors 3T66 and 3T68. The common-mode voltage at circuit node 78 is shown connected to the gate of transistor 3T58. The common connection between the gate and drain of transistor 3T60 is commonly coupled to the gates of feedback transistors 3T66 and 3T68. The drain electrodes of 3T66 and 3T68 provide kick-start feedback current signals via circuit leads 86 and 88 which are connected back to the common drain connections of 3T7, 3T9 and 3T8, 3T10 which are also common to circuit nodes 62 and 64 of FIG. 3A.

Thus what has been shown and described is a balanced differential amplifier including a common-mode feedback circuit, but now additionally having a common-mode kick-start circuit to ensure that the differential amplifier will start up and operate in its intended region. Adding the kick-start circuit allows the tail current common-mode servo technique to be used in a baseband channel, where power, output offset and stability are significantly improved relative to the same amplifiers using active load current, common-mode servoing or folded-cascode current servoing.

Figure 4B:
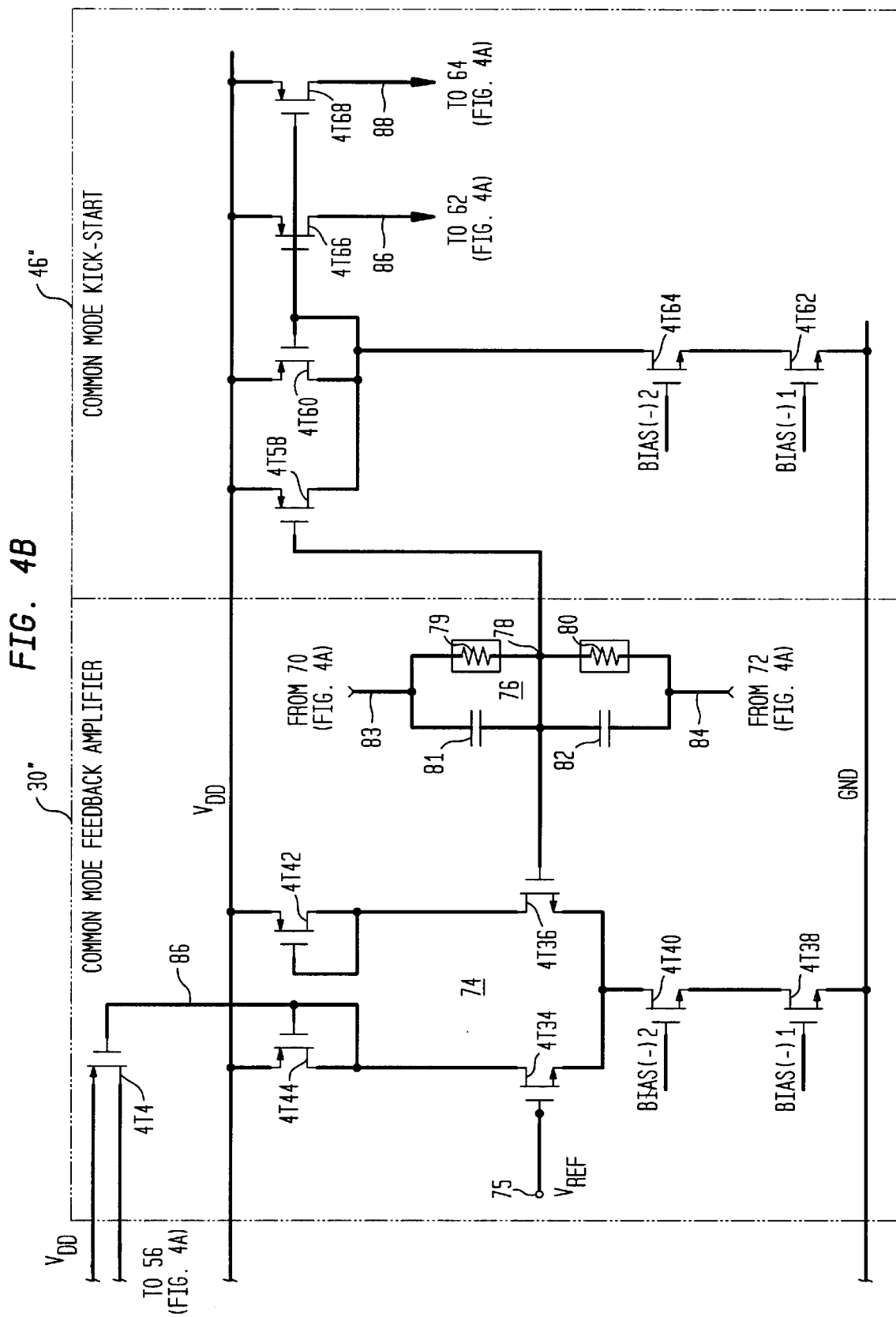

With respect to the PNP/P-channel circuit configuration shown in FIG. 4, which includes FIGS. 4A and 4B, it includes a balanced differential amplifier 10", common-mode feedback amplifier 30", and a common kick-start a circuit 46" and corresponds to the same numbered circuits as shown in FIG. 3 except that now the semiconductivity types of the transistors are reversed, and requiring a reversal of the connection of the VDD supply voltage and ground. The signal paths remain the same, accordingly a detailed discussion of FIG. 4 would be simply repetitive and therefore is deemed unnecessary for a clear understanding of the invention.

Having thus shown and described what is at present considered to be the preferred embodiments of the subject invention, it should be noted that the same has been made by way of illustration and not limitation. Accordingly, all modifications, alterations and changes coming within the spirit and scope of the invention as set forth in the appended claims are herein meant to be included.

What is claimed is:

1. A differential amplifier circuit, comprising:
   a balanced differential amplifier circuit including first and second input ports and first and second output ports;
   a common-mode feedback circuit connected to the first and second output ports of the differential amplifier circuit and generating a common-mode feedback signal, the common-mode feedback signal being coupled back to a predetermined circuit node of the balanced differential amplifier circuit and forming a common-mode servo loop thereby;
   a kick-start circuit connected to the common-mode feedback circuit and generating a kick-start feedback signal, the kick-start feedback signal being coupled to a predetermined circuit node of the differential amplifier circuit to ensure that the circuit will start up and operate in an intended region of operation; and
   a differential feedback circuit connecting the first output port to the second input port and the second output port to the first input port.

2. A differential amplifier circuit in accordance with claim 1 wherein the differential amplifier circuit, the differential feedback circuit, the common-mode feedback circuit and the kick-start circuit are fabricated in an integrated circuit structure.

3. A differential amplifier circuit in accordance with claim 1 wherein said balanced differential amplifier includes:
   an input stage connected to said first and second input ports, a feedback circuit element for coupling said common-mode feedback signal to said input stage;
   an intermediate output stage connected to said input stage and generating a pair of intermediate output signals; and
   a pair of balanced output stages connected to said intermediate output stage and being responsive to respective ones of said pair of intermediate output signals for generating first and second output signals at said first and second output ports.

4. A differential amplifier circuit in accordance with claim 1 wherein said input stage includes junction type or field effect type transistor circuit elements, having respective base or gate electrodes connected to said first and second input ports, having respective emitter electrodes or source electrodes commonly connected to a current source and said feedback circuit element, and having respective collector electrodes or drain electrodes connected to said intermediate output stage.

5. A differential amplifier circuit in accordance with claim 4 wherein said intermediate output stage comprises a cascode circuit configuration of first and second type transistor circuit elements and wherein said pair of intermediate output signals are provided at respective first and second circuit nodes between said first and second type transistor circuit elements.

6. A differential amplifier circuit in accordance with claim 1 wherein said cascode circuit configuration comprises a folded cascode circuit configuration comprised of two sets of said first and said second type transistor circuit elements.

7. A differential amplifier circuit in accordance with claim 6 wherein each set of said two sets of transistor circuit elements include a pair of first type of cascode transistor circuit elements and a pair of second type of cascoded transistor circuit elements connected in series across a source of supply voltage, and wherein said collector electrode or drain electrodes of said transistor circuit elements of said input stage of the balanced differential amplifier are connected between transistor circuit elements of one of said pairs of cascoded transistor circuit elements.

8. A differential amplifier circuit in accordance with claim 3 wherein each output stage of said pair of balanced output stages include a first and a second type of transistor circuit element connected in series across a source of supply voltage, wherein said pair of intermediate output signals are respectively connected to an input electrode of one of said first and second types of transistor circuit elements, and wherein respective output signals are coupled from mutually connected like electrodes of said first and second type of transistor circuit elements.

9. A differential amplifier circuit in accordance with claim 1 wherein said common-mode feedback circuit includes an electrical impedance network connected across said first and second output ports of said balanced differential amplifier and generating a common-mode voltage signal at a circuit node thereof, said common-mode voltage signal being coupled to said circuit node of said balanced differential amplifier.

10. A differential amplifier circuit in accordance with claim 9 and additionally including a feedback amplifier circuit coupled between said circuit node of said impedance network and said circuit node of said balanced differential amplifier.

11. A differential amplifier circuit in accordance with claim 10 wherein said feedback amplifier comprises a differential amplifier circuit coupled across a source of supply voltage and having first and second inputs and a common mode output, one of said inputs being connected to said circuit node of said impedance network and one of said inputs being connected to a source of reference voltage, and wherein said common-mode output is connected to said circuit node of said balanced differential amplifier.

12. A differential amplifier circuit in accordance with claim 4 wherein said differential amplifier circuit of said feedback amplifier comprises a semiconductor amplifier circuit including a current source and an active load.

13. A differential amplifier circuit in accordance with claim 12 wherein said semiconductor amplifier circuit of said feedback amplifier includes a pair of source coupled field effect transistors including gate, source and drain electrodes, wherein said source electrodes are connected to said current source, said gate electrodes are respectively connected to said circuit node of said impedance network and said source of reference voltage, and said drain electrodes are connected to said active loads, and wherein said active load comprises respective transistor circuit elements.

14. A differential amplifier circuit in accordance with claim 9 wherein said impedance network includes a pair of series connected common-mode sense resistors.

15. A differential amplifier circuit in accordance with claim 14 wherein said impedance network additionally includes respective capacitors connected in parallel with said common-mode sense resistors.

16. A differential amplifier circuit in accordance with claim 9 wherein said kick-start circuit includes first and second kick-start feedback circuit elements coupled to said electrical impedance network and being responsive to said common-mode signal for generating and coupling first and second kick-start feedback signals to first and second circuit nodes of said intermediate output stage.

17. A differential amplifier circuit in accordance with claim 16 wherein said first and second feedback circuit elements comprise transistor circuit elements.

18. A differential amplifier circuit in accordance with claim 16 and additionally including a common-mode signal sensing circuit coupled between said first and second feedback circuit elements and said electrical impedance network generating said common mode signal.

19. A differential amplifier circuit in accordance with claim 10 wherein said common-mode sensing circuit includes at least one transistor circuit element.

20. A differential amplifier circuit in accordance with claim 19 wherein said common-mode sensing circuit comprises a pair of common drain field effect transistors, wherein each of said field effect transistors include gate, source and drain electrodes, the drains and source electrodes are connected across a source of supply voltage via a dual series connected field effect transistor current source, the gate electrode of one field effect transistor of said pair of field effect transistors is connected to said electrical impedance network so as to be responsive to said common-mode signal, and wherein the gate and drain electrodes of the other field effect transistor of said pair of field effect transistors are commonly connected to the transistor circuit elements of said first and second kick-start feedback circuit elements.

21. A differential amplifier circuit, comprising:
a balanced differential amplifier circuit including first and second input ports and first and second output ports;
a common-mode feedback circuit including an electrical impedance network connected across the first and second output ports of the differential amplifier circuit and generating a common-mode feedback signal at a circuit node thereof, the common-mode feedback signal being coupled back to said circuit node of the balanced differential amplifier circuit and forming a common-mode servo loop thereby; and
a kick-start circuit connected to the common-mode feedback circuit and generating a kick-start feedback signal, the kick-start feedback signal being coupled to a predetermined circuit node of the differential amplifier circuit to ensure that the circuit will start up and operate in an intended region of operation,
said kick-start circuit including first and second kick-start feedback circuit elements coupled to said electrical impedance network and being responsive to said common-mode signal for generating and coupling first and second kick-start feedback signals to first and second circuit nodes of said intermediate output stage.

22. A differential amplifier circuit in accordance with claim 1 wherein the differential amplifier circuit, the differential feedback circuit, the common-mode feedback circuit and the kick-start circuit are fabricated in an integrated circuit structure.

23. A differential amplifier circuit in accordance with claim 21, wherein the differential amplifier circuit, the differential feedback circuit, the common-mode feedback circuit and the kick-start circuit are fabricated in an integrated circuit structure.

\* \* \* \* \*